(12) United States Patent
Woo et al.

(10) Patent No.: US 6,574,759 B1
(45) Date of Patent: Jun. 3, 2003

(54) METHOD FOR VERIFYING AND IMPROVING RUN-TIME OF A MEMORY TEST

(75) Inventors: Steven Cameron Woo, Saratoga, CA (US); John Philip Privitera, San Mateo, CA (US); Mark Alan Horowitz, Menlo Park, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 09/484,431

(22) Filed: Jan. 18, 2000

(51) Int. Cl.[7] .............................................. G11C 29/00
(52) U.S. Cl. ...................................................... 714/718
(58) Field of Search ........................... 714/718; 211/100

(56) References Cited

U.S. PATENT DOCUMENTS

| | | | | |
|---|---|---|---|---|
| 4,801,870 A | * | 1/1989 | Eichelberger et al. ...... | 714/732 |
| 5,740,353 A | * | 4/1998 | Kreulen et al. ................ | 714/33 |
| 5,974,241 A | * | 10/1999 | Fusco ............................. | 716/2 |
| 6,080,203 A | * | 6/2000 | Njinda et al. .................. | 703/14 |
| 6,170,078 B1 | * | 1/2001 | Erle et al. ...................... | 714/25 |
| 6,212,667 B1 | * | 4/2001 | Geer et al. ..................... | 714/35 |
| 6,295,623 B1 | * | 9/2001 | Lesmeister et al. .......... | 714/724 |
| 6,311,317 B1 | * | 10/2001 | Khoche et al. ................ | 716/18 |
| 6,327,686 B1 | * | 12/2001 | Grundmann et al. ........ | 714/724 |
| 2001/0037497 A1 | * | 11/2001 | Kumon ........................... | 717/9 |
| 2002/0010909 A1 | * | 1/2002 | Charisius et al. .............. | 717/2 |
| 2002/0016954 A1 | * | 2/2002 | Charisius et al. .............. | 717/2 |
| 2002/0029231 A1 | * | 3/2002 | Aptus et al. .................. | 707/513 |
| 2002/0032900 A1 | * | 3/2002 | Charisius et al. .............. | 717/2 |

* cited by examiner

*Primary Examiner*—Albert Decady
*Assistant Examiner*—Cynthia Britt
(74) *Attorney, Agent, or Firm*—Pennie & Edmonds LLP

(57) ABSTRACT

A method of generating and verifying a memory test is disclosed. A simulator is used to verify that the sequence of time-ordered commands complies with a set of operating constraints for the memory. A packer may thereafter be used to optimize run time of the verified test.

20 Claims, 3 Drawing Sheets

METHOD FOR VERIFYING AND IMPROVING RUN-TIME OF A MEMORY TEST

BACKGROUND OF THE INVENTION

Memory devices, including Dynamic Random Access Memories (DRAMs), are implemented as integrated circuits (ICs). The decreased size, increased storage capacity, increased operating speed, and expanded capabilities of memory device ICs have revolutionized computer systems, telecommunications equipment and consumer electronics. However, these attributes have also created a number of technical challenges. Testing is one such challenge.

Integrated circuits implementing memory devices must be reliable. Accordingly, memory devices have been tested since their first manufacture. Very early in the history of memory device testing, specialized equipment and automated test routines were developed to improve testing efficiency. As the capacity and capabilities of memory devices increased, a broad range of tests were automated. Different memory device manufacturers prescribed different testing routines. Test equipment is typically custom and memory device testing routines were written specific to the custom test equipment.

Tests for memory devices may be conveniently divided into two categories; "test vectors," and "algorithmic patterns." A test vector typically consists of a linear set of operations to be performed. A test vector is often written in lower level language like assembly code. Test vectors access one or more memory device components and directly test their functionality over a range of common and end cases. For example, a write buffer might be run through a series of read/write sequences to verify correct operation.

An algorithmic pattern typically consists of a program written in a higher level language which better supports looping and branching constructs for the memory device test. In many conventional implementations, algorithmic patterns are written in a language that looks like a cross between microcode and assembly language. Such "languages" provide a richer set of control commands and expressions. Unfortunately, algorithmic patterns tend to generate some quirky side-effects within the test equipment. For example, dedicated hardware registers in the test equipment may become corrupted with invalid data during the generation of complicated test patterns. Such problems not withstanding, algorithmic patterns remain a mainstay of memory device test protocols. This is not surprising given the great number of memory locations which must be tested in contemporary memory devices. The practical implementation of a test which repeatedly writes data patterns to every location in a memory device requires some sort of looping operation. A set of linear test vectors sufficient to test the full storage capacity of contemporary memory deices would be impossibly long.

A "test" consists of one or more test vectors and/or one or more algorithmic patterns. In creating a test, a test writer must define a sequence of operations which store and retrieve data to/from the memory device in accordance with certain "operating constraints." Operating constraints take many forms including state-based and timing-based constraints, as well as other constraints which govern the proper operation of the memory device. (Attempting to CAS a bank of memory before it has been properly RASed in one example of a state-based constraint being violated. Attempting to CAS a memory bank too soon after it was RASed is an example of a timing constraint being violated). The operation of early memory devices was simple and characterized by relatively few constraints. As memory devices have increased in complexity, a greater number of operating constraints have arisen. These constraints must be observed and accounted for during the definition and creation of a test.

Contemporary memory devices allow multiple transactions to be handled simultaneously. Compared to their predecessors, contemporary memory devices have an increased number of operating constraints which must be obeyed during a sequence of memory system operations. Further, the use of packets to exchange control/address information and data greatly expands the number of constraints which must be obeyed during the definition of a memory device test protocol. Not only does the number of constraints (or rules) increase for each individual transaction defined within the test protocol, but also the number of interactions between the various rules increases as multiple concurrent transactions are performed to fully test the capabilities of the memory device.

All of the foregoing has created quite a mess. Each memory device manufacturer prescribes a set of tests which targets different aspects of their particular design. Memory device test writers currently generate test protocols without benefit of a tool which provides feedback as to whether or not a test step or test routine violates one or more memory device constraints.

Accordingly, when a memory device fails a test, it is not certain whether the memory device is truly broken, or whether the test has been improperly constructed. In such circumstances, the test writer might ask the memory device designers whether the present interpretation of memory device constraints is correct. However, even if the interpretation is correct, the constraints may not be properly expressed in the written test code. Often a memory device "known-to-be-good" is used to test the test. This method presumes that the "known-good" memory device is still good despite its repeated handling in the test facility.

The flowchart of FIG. 1 illustrates a typical conventional process through which a memory device test is generated. Using current interpretations of memory device constraints, a test is created 2, and run 3 on a memory device. If the memory device passes the test (4=yes), the test and the memory device are assumed to be good. As mentioned above, this assumption is often bolstered by the use of a "known-good" memory device during test development.

If the memory device fails the tests (4=no), the test writer is left in doubt as to whether the device failed on its own accord or whether the test is bad 6. Assuming the test has violated some memory device constraint (7=yes), the test is changed 9 and the new test is run 3. If the test writer has confidence in the test (7=no), the memory device is replaced 8 and the test is re-run 3.

The conventional process of test generation thus relies on assumption and "trial-and-error" tactics to arrive at a test presumed to be good. Further, each new test must be verified against a number of different conditions, such as temperature, data state, power level, etc. The process of test design is lengthy and fraught with doubt. In fact, errors may enter the test design process during any one of steps 2, 5, 6, 7 and 9 in the exemplary process shown in FIG. 1.

For example, a timing constraint, such as the minimum period between RAS-to-CAS (tRCD), might be violated by a test which defines a slightly shorter period than that prescribed by the memory device specification. Using this constraint as an example, one batch of memory devices might pass the test even though the test violates the specification for the devices. As a result, the test and the batch of memory devices are assumed to be good. (Step 5 above). As it turns out, the test violates the minimum tRCD period for the memory device, but the first batch of memory devices were able to tolerate the shorter than specified period for tRCD. Unfortunately, a subsequent batch of memory devices, while in actuality meeting specification, are not able to tolerate the shorter tRCD period defined by the test. Because the test has been assumed "good," the later batch of memory devices will be considered out-of-specification and may be thrown out. Such an error in the test protocol may not be caught until many good parts have been discarded as bad.

This result arises because the conventional process of generating a test does not include a mechanism for verifying compliance with actual memory device constraints. Only after a number of memory devices have successfully passed a test is the test assumed to be good. The conventional process of test generation thus involves a "chicken and egg" problem. In order to verify a test, "known-good" memory devices are required. However, known-good memory devices can not be identified until a valid set of tests have been run. Currently, this impasse is breached by running a "mother-of-all-vectors" test on memory devices in an attempt to identify known-good memory devices. While such an approach may serve to verify the memory device interface functionality, it can not reasonably test the entire core of the memory device.

In sum, as memory devices (or memory modules comprising a number of memory devices), memory controllers, and the exchange of data between the memory devices and the memory controller become more complex, the process of generating and verifying tests becomes vastly more complex. Beyond a certain level of complexity, effective test generation requires some additional means of verifying the test.

In addition to writing a test which adheres to the increasing multiplicity of memory device constraints, a test writer is motivated to write efficient tests. The time required to perform a test typically rises as memory devices increase in capacity and complexity. Often the goals of writing a complete, constraint compliant test and writing a run-time efficient test are at odds.

The process of generating memory device tests also requires some means for writing and expressing the tests in a higher level language. The current use of low-level commands, such as Direct RDRAM protocol operations, for example, necessitates that test writers be familiar with such cryptic programming means. Such a requirement unduly burdens test writers and inhibits the development of tests.

SUMMARY OF THE INVENTION

In a first general aspect, the present invention provides a method by which a test writer may determine whether a proposed test violates any operating constraint for the memory device being tested. A simulator for a collection of one or more memory devices is developed using a parameter list covering all relevant constraints. A test is typically defined by a sequence of time-ordered operations. This time-ordered sequence is passed through the simulator to verify that it adheres to the operating constraints.

Constraint violations are indicated by error messages. The error messages may offer suggested fixes, such as timing adjustments required to place the sequence of operations in compliance with the constraints.

In a second general aspect, the present invention provides a "packer" function. A verified test may be passed through the packer to reduce its run-time in relation to the given constraints.

The present invention further provides methods for addressing the issue of programming language translation. Recognizing that the simulator is compatible with one programming language while a custom tester is compatible with another programming language, the present invention allows translation from one programming language to the other. In such cases, a test may be written in a tester compatible language and translated before verification in the simulator, or the test may be written in a simulator compatible language and translated after verification and run-time reduction.

DETAILED DESCRIPTION

Figure 1:
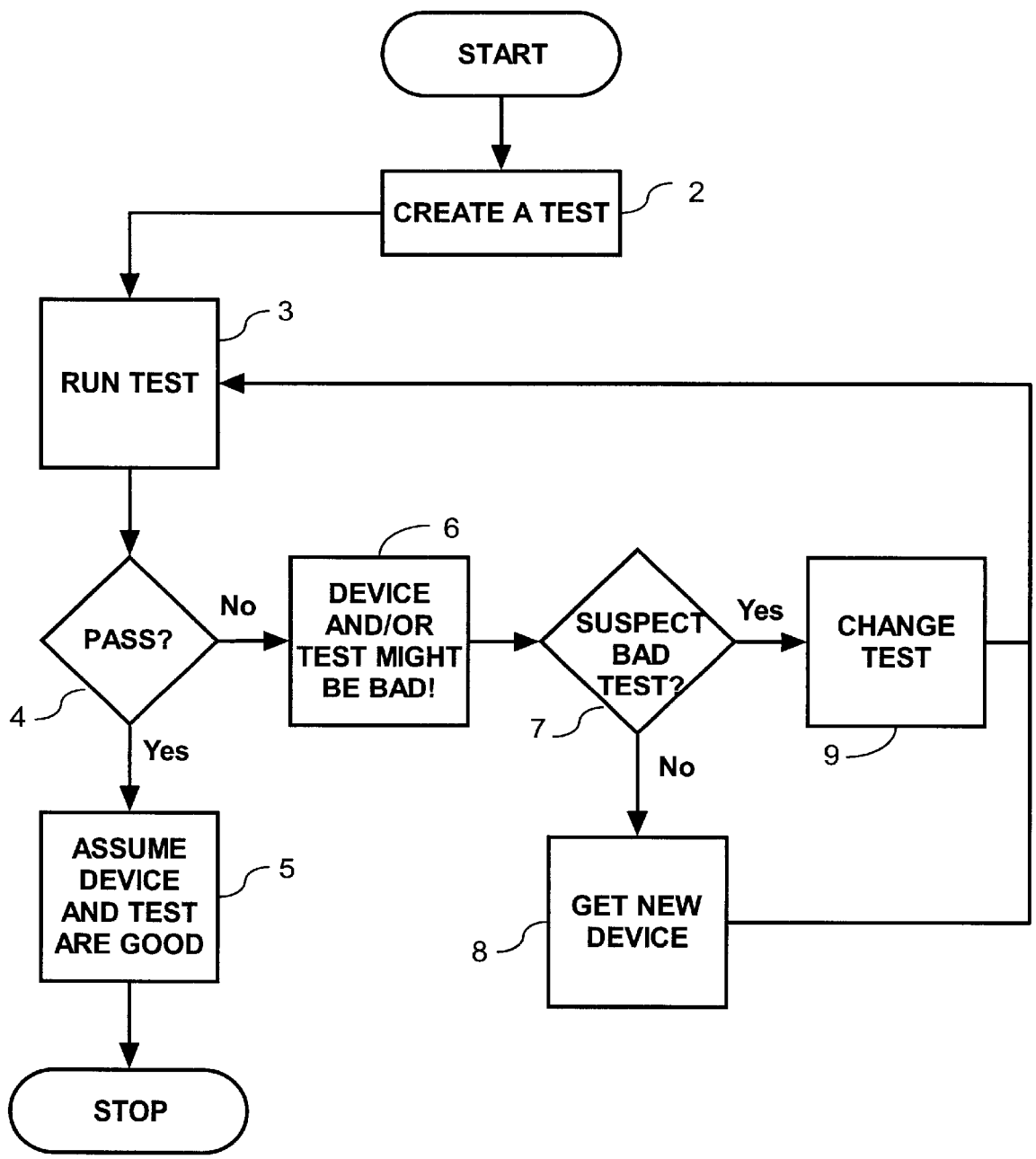
FIG. 1 is a flowchart illustrating a conventional method for generating a memory device test.

At points in the following discussion, the terms "optimize," "optimizing," "minimize," "minimizing," and their like are used to describe the effect of the present invention. These are relative terms in the sense that the present invention, at least in one aspect, is capable of significantly reducing the run-time of a test. However, one of ordinary skill in the art will recognize that any run-time reduction realized by the present invention is made in relation to a particular set of system constraints. Change the constraints and the run-time reduction realized may change as well. Thus, the foregoing terms should not be limited to absolute definitions of the minimum, or the optimal solution. Rather, "optimize" should, for example, be read as "further optimize, given the existing set of constraints." For the sake of clarity, however, such wordier characterizations are omitted in favor of the simpler terms noted.

The exemplary embodiments which follow are described in the context of a high-speed memory system which uses packetized control/address and data exchanges between a memory controller and one or more memory devices via a communications channel. That is, the test(s) generated, verified and run-time optimized by the present invention have particular application to at least contemporary memory systems like those designed by Rambus. Inc. of Mountain View, Calif. The Rambus DRAM (RDRAM) and its application in high-speed memory systems are well documented in available technical literature. While the present invention has been developed in relation to the Rambus memory architecture, it has much broader application. In fact, any test directed to a memory having a complex set of constraints will benefit from the dictates and teaching of the present invention.

The expression "memory device test(s)" is used throughout to broadly denote a test which exercises not only the internal functionality and storage capabilities of a memory device or a collection of memory devices (such as a module), but also the ability of the memory device or module to communicate with an external memory controller.

Thus, as expressed herein, "testing" a memory device connotes all aspects of transferring control/address information and data to and from the memory device, as well as storing data and retrieving data from the memory device.

In one aspect of the present invention, the behavior of a memory device or a memory module comprising one or more memory devices is simulated. The simulator is event-driven and directly models the behavior of one or more memory devices or modules on a communications channel.

The test writer provides a parameter file to the simulator that describes the architectural and timing characteristics of the memory device or module being simulated. The parameter file defines the operating constraints specified for the memory device. A time-ordered sequence of memory device operations are also input into the simulator. This set of operations is the test as first generated. It defines one or more vectors and/or algorithmic operations designed to exercise memory device functionality and storage capabilities. The present invention, as described in greater detail below, receives both the parameter file and the set of operations in text format which is easily read and understood. Thus, a familiarity with cryptic assembly languages is not a prerequisite to understanding and contributing to the test generation process facilitated by the present invention.

The simulator runs the set of operations against the set of constraints defined by the parameter file. If the list of operations violates a constraint, the simulator provides an error message. The error message is typically provided on a display screen associated with a computer system running the simulator. Errors are preferably identified in sequence, since the simulator will typically traverse the set of operations in a time-ordered sequence. Sequential error identification allows the test writer to verify early operations which may impact later operations in the test.

However, while presently preferred, error messages need not be sequentially related to a time-ordered set of operations. For example, some set of operations may include "JUMP" or "GOTO" branching operations which are implicated by a number of conditions. When executed, these operations may essentially re-order the set of operations according to the conditions.

Error messages may include a variable level of user feedback depending on the desired sophistication of the simulator. State-based error messages will communicate the state or memory device resource in conflict. State-based error messages may also identify a suggested state adjustment which will overcome the identified violation. Time-based error messages will communicate the timing constraint being violated. Time-based error messages may also identify a suggested timing adjustment which will overcome the identified violation.

The temporal relationship between operations in the set of operations has meaning beyond the ability of the set of operations to conform to the timing constraints expressed in the parameter file. As mentioned above, memory device testing must be as time efficient as possible to minimize testing overhead and associated costs.

Thus, in a second general aspect, the present invention provides a packer, i.e., a function which temporally "packs" the operations as tightly as possible given the current set of constraints. The packer accepts the time-ordered sequence of operations and the parameter file as inputs. The packer then iteratively calls the simulator to produce a version of the time-ordered sequence which minimizes the time allocated between different operations. In one embodiment of the packer, no attempt is made to re-order the sequence of operations. However, in other embodiments, re-ordering may be performed or suggested to the user. Further, write buffer side effects, where present, are maintained between unpacked and packed versions of the operations sequence. For example, if the unpacked sequence of operations calls for a write buffer to be cleared before the next operation, the packed sequence of operations maintains this requirement.

In this manner, operations are packed together as tightly as possible within the limits specified by the parameter file. When the simulator and packer are used together, a test writer need not worry about minimizing the time allocated between operations in the sequence of operations when the test is being written. Rather, when written the sequence of operations may be safely padded with time, and the packer function can thereafter be relied upon to generate a constraint compliant sequence of operations having optimal inter-operation timing with respect to the defined constraints. In effect, the burden of remembering and optimizing inter-operation timing considerations for a particular memory device or collection of one or more memory devices or modules is completely lifted from the test writer.

While the application of packer to a test offers significant benefit to test writers, and while much of this benefit may be derived in the automated output of the packer function, it should be recognized that the expansive breadth of possible tests preclude a trivial "one-size " fits all approach to test verification and optimization. For example, the effective application of the packer to some algorithmic tests comprising complex looping functions is non-trivial. Loop function annotations, i.e., comments written with the code implementing the loop function, might be necessary for packer to determine "pre-optimization" the structure of the loop. In fact, restrictions may necessarily be placed on the structure of loops in a test. Further, the present invention may be used to effectively verify and optimize such algorithmic tests by providing feedback to hand-alter the test, rather than the automated method described above.

In a similar vein, the present invention recognizes that some tests can be very long, and involve so many protocol operations that full simulation is impractical. Fortunately, many of these very long tests incorporate a unique test routine (or test kernel) which is repeated at great length. For such tests, the present invention may be used to verify and optimize the test kernel and extrapolate the resulting feedback to alter the entire test.

Such routine tradeoffs are left to the practitioner. Rather than merely verify the test kernel, the entire very lengthy test may be verified and run-time optimized, provided the test writer is willing to wait during the lengthy period of time such "full testing" may require. Alternatively, extremely powerful test hardware may be used to reduce the test verification and/or run-time optimizing time.

As implemented, the present invention effectively addresses "translation" issues while providing the simulator and packer functions to the test writer. As presently preferred, the simulator is written in a high level language like "C" on a UNIX based platform. A standard tool set or threads package, such as the CSIM17 software library offered by Mesquite Software™, may be used to write the simulator. The simulator may be written to test memory devices on an individual basis, in groups (such as modules), and/or to test a channel fully populated channel with memory modules. The packer function is presently implemented as a "Perl script," a well known UNIX programming language.

In contrast, most testers require that a test be created and run in an entirely different language. Given existing, significant capital investment in testers and the custom nature of tester development, a translation must occur between the tester environment and the simulator/packer environment. Such translation is best accomplished by a piece of code separate from the simulator, since it must be written in relation to the specific tester compatible programing language.

Use of a higher level language to write the simulator allows a related group of primitive memory device operations to be expressed as a single command. When executed during simulator operation, such a command is converted back into the set of primitive operations. The conversion process is transparent to the test user. Commands thus defined within the simulator are akin to conventional software "macros." A command may have timing information embedded within it, or it may be a simple list of primitive operations. Commands lacking timing information are very much like memory controller commands. In fact, the set of memory controller commands may be readily drawn upon to help define efficient simulator commands. For example, the command "Fetch Byte" might consist of a RAS operation, a CAS operation, and a Precharge operation. Conversion of the command might be performed in either a software model, written with reference to the memory controller command definitions, or an application specific integrated circuit (ASIC). However implemented, the conversion interpreter translates the command into a corresponding set of primitive operations.

By allowing the definition of macros, a library of validated high-level commands can be developed which allows a test writer to efficiently express a complex set of primitive operations without sacrificing accuracy. Test users, often different from the test writer, may review the high level code implementing the test to better understand the test's flow and application. User feedback refining subsequent test generations is thus facilitated. Finally, once effective macros are defined, subsequent test writers, perhaps lacking a detailed knowledge of the underlying primitives, may nonetheless write or modify memory device tests in a competent manner.

Figure 2:
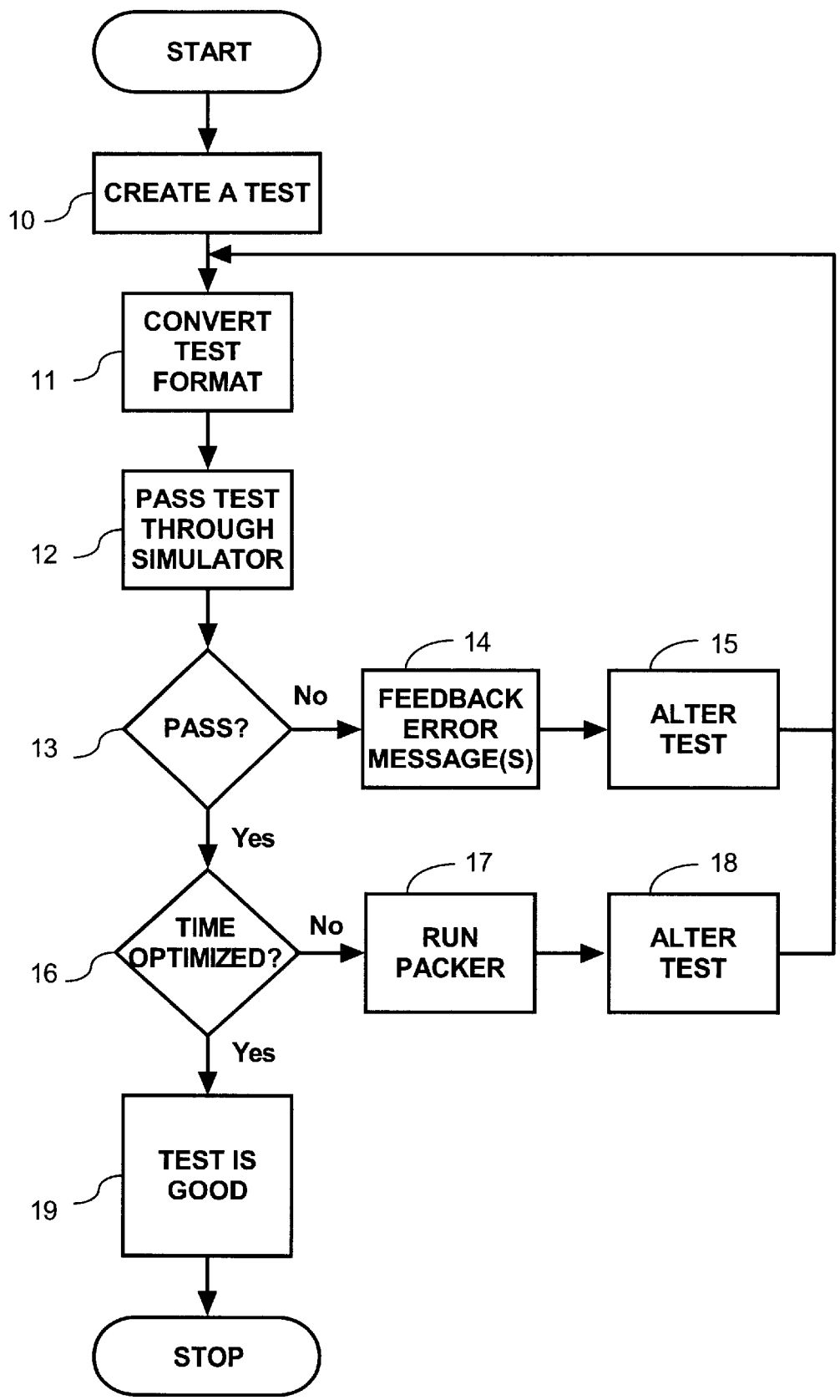
FIG. 2 is a flowchart illustrating a method of generating and verifying a memory device test according to one aspect of the present invention.

FIG. 2 is a flowchart illustrating use of the simulator and packer functions of the present invention to generate and verify a memory device test. Once a test is created 10 it may need to be translated from a tester-compatible language into a simulator/packer compatible language 11. In other words, the test must conform to the simulator's input format. Since the simulator is written in a higher level language, tester compatible language conversion, if necessary, is readily accomplished.

Once the test is compatible with the simulator language, the test is passed through the simulator 12. If the test does not violate any constraint defined by the parameter list implemented in the simulator (13=yes), no error message is generated and the test is ready for run-time optimization in the packer.

If, however, the simulator returns one or more error messages (13=no and 14), the test is altered to correct the noted constraint violations 15, and the test is run through the simulator again. This process is performed iteratively until the test passes through the simulator without error (13=yes).

Once the test complies with all constraints checked by the simulator, it is run through the packer (16=no and 17). Packer may dictate alteration of the test 18 to minimize the run-time of the sequence of operations. Like the simulator, the packer may be run a number of times until the test is fully optimized. Thereafter, the test is accepted as good 19 and may be placed in a suite of memory device tests.

Figure 3:
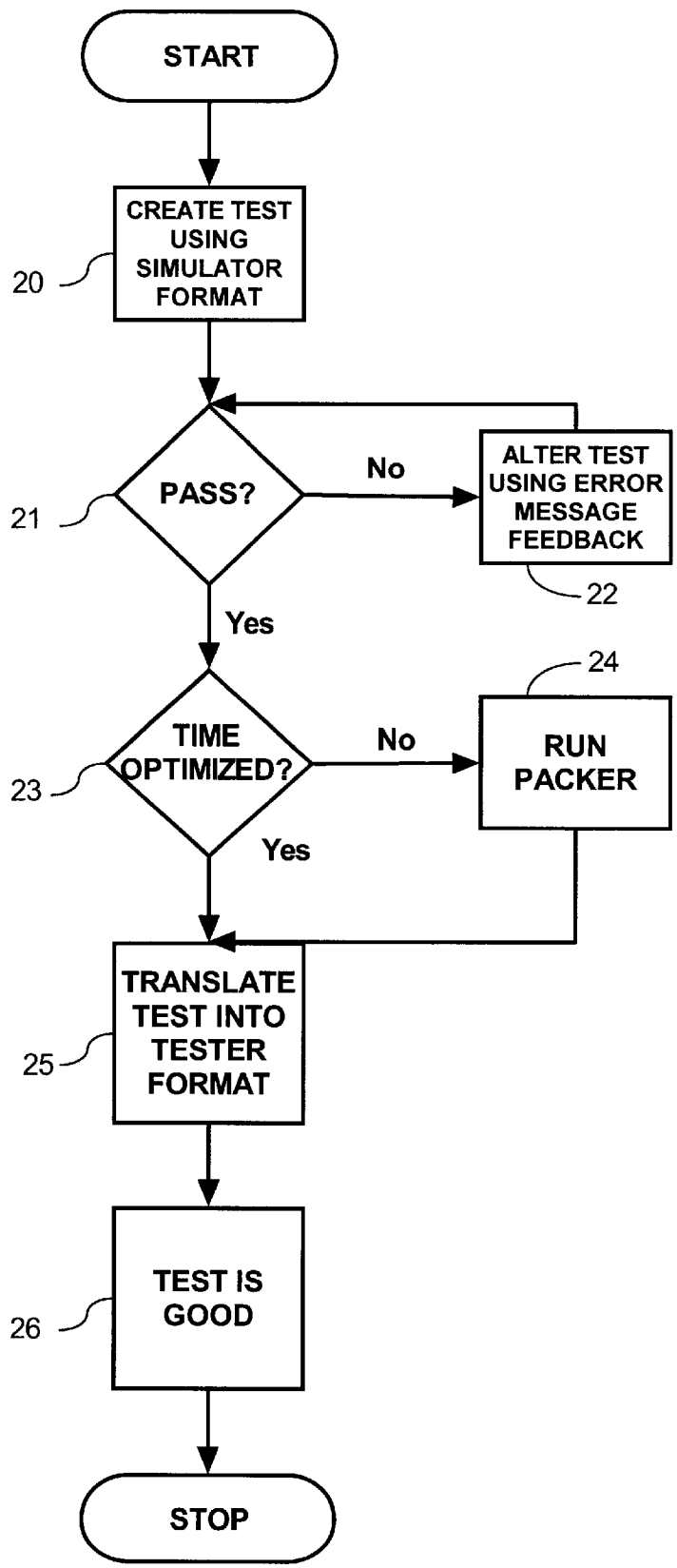
FIG. 3 is a flowchart illustrating a method of generating and verifying a memory device test according to another aspect of the present invention.

The flowchart shown in FIG. 3 illustrates another method by which the simulator and packer of the present invention may be used to generate and verify a memory device test. In the second illustrated approach, the test is first written in a simulator compatible language 20 without regard to the ultimate language or format used by the tester. This is at odds with the first approach discussed above which assumes an existing test written in tester compatible language.

By writing the test in a format compatible with the simulator, the front end translations required in the first approach are avoided. The test is then passed through the simulator. If one or more error messages are returned (21=no) the test is altered according to the noted errors 22 and re-run. The first approach requires that the test be modified when error(s) are found in the tester language. This modification will take place in the tester compatible language. Thus, translation between the two programming languages must take place repeatedly as the test is run iteratively through the simulator. The second approach does not require this repeated programming language translation as part of the iterative test generation and verification process.

Once the test passes through the simulator without error (21=yes), it may be time optimized by running the packer (23=yes and 24). Only after being verified against a complete set of memory device constraints and optimized in run time is the test translated from the simulator/packer compatible language to the tester compatible language 25, if necessary. Finally, the test is accepted as good 26 and is ready to used in actual testing.

By either method specifically illustrated or their equivalents, the present invention solves the problems inherent in the conventional method for generating memory device tests. Operating constraints are observed and automatically checked during the test generation. Resulting tests are known to be "good" in relation to actual constraints specified for the memory device. In contrast, the tests resulting from the conventional process are only known to be good in relation to some set of selected memory devices. When memory devices fail the conventional test, the tester is left to question whether the problem resides with the test or the new set of memory devices.

As memory devices and memory systems become increasingly complex over time, the test writer may write an entirely new suite of tests, re-write selected tests that have become outdated in view of the new memory device(s), or merely add one or more new tests to an existing suite of tests which are specifically directed to the expanded functionality of the new memory device(s). Since tests may be written in a higher level language, test generation is efficient.

Further, tests which conform to all memory device constraints may be optimized in their run-time by the present invention's packer function. Test writers need not struggle to efficiently time a sequence of operations under development. Rather, operations may be spaced with such extra time as is required to allow any combination of operations to run. Subsequently, packer will squeeze the sequence of operations down to its optimal run time.

Conventional test vectors and algorithmic patterns are often written in cryptic assembly code. It is often difficult to tell how much time passes, or even what operation is being performed in the tests written in such languages. The definition and expression of the simulator and packer of the present invention may be had in a higher level language. By using the same text-based programming language to write a test, the test writer may create a program which is very readable. Once written, verified, and run-time optimized, the test may be translated by a separate piece of code into a tester compatible language.

The input format to the simulator may be readily modeled in accordance with the packet commands used in a memory system incorporating the memory devices to be tested. That is, assuming an existing command format or structure between a memory controller and a memory device, this format may readily serve as the basis for the simulator's input format.

The present invention has been described in relation to several examples. These are, however, merely teaching examples. The examples are drawn to individual memory devices and collections or groups of memory devices susceptible to the benefits of the present invention. However, the present invention may be used to verify and/or run-time optimize a test for any "memory." The physical form or architecture of the memory being tested is not a limiting factor in the application of the present invention, so long as an accurate simulator can be developed for the memory.

What is claimed is:

1. A method of generating a test for a memory having defined operating constraints, the method comprising:

developing a set of operations defining the test, where the set of operations is ordered in time;

passing the set of operations through a simulator capable of determining whether the set of operations violates any one of the operating constraints; and upon determining that the set of operations violates any one of the operating constraints, outputting an error message, wherein the error message comprises an adjustment to the set of operations which will resolve the operating constraint violation.

2. A method of generating a test for a memory having defined operating constraints, the method comprising:

developing a set of operations defining the test, where the set of operations is ordered in time;

passing the set of operations through a simulator capable of determining whether the set of operations violates any one of the operating constraints; and upon determining that the set of operations violates any one of the operating constraints, outputting an error message, wherein the error message identifies a violated state-based constraint.

3. The method of claim 2, wherein the error message further identifies a state adjustment to the set of operations which will resolve the state-based constraint violation.

4. A method of generating a test for a memory having defined operating constraints, the method comprising:

developing a set of operations defining the test, where the set of operations is ordered in time;

passing the set of operations through a simulator capable of determining whether the set of operations violates any one of the operating constraints; and upon determining that the set of operations violates any one of the operating constraints, outputting an error message, wherein the error message identifies a violated time-based constraint.

5. The method of claim 4, wherein the error message further identifies a timing adjustment to the set of operations which will resolve the time-based constraint violation.

6. A method of generating a test for a memory having defined operating constraints, the method comprising:

developing a set of operations defining the test, where the set of operations is ordered in time;

passing the set of operations through a simulator capable of determining whether the set of operations violates any one of the operating constraints;

upon determining that the set of operations violates any one of the operating constraints, outputting an error message;

altering the set of operations in response to the error message; and passing the altered set of operations through the simulator.

7. The method of claim 6, wherein the steps of altering the set of operations in response to the error message, and passing the altered set of operations through the simulator are repeated until an altered set of operations passes through the simulator as a good test without an error message being generated.

8. The method of claim 7, further comprising:

passing the good test through a packer to minimize run time of the good test in relation to the operating constraints.

9. A method of assessing a test for a memory having defined operating constraints, the method comprising:

accessing a parameter list expressing the operating constraints;

defining a simulator for the memory in accordance with the parameter list using a first programming language;

developing a set of operations defining the test, wherein the set of operations is developed in a second programming language;

converting the set of operations from the second programming language to the first programming language; and verifying the test by passing the set of operations through the simulator.

10. The method of claim 9, wherein the step of verifying the test further comprises:

(a) outputting an error message upon determining violation of any one of the operating constraints in the simulator;

(b) altering the set of operations in relation to the error message; and, (c) repeating (a) and (b) until the set of operations passes through the simulator without outputting an error message.

11. A method of assessing a test for a memory having defined operating constraints, the method comprising:

accessing a parameter list expressing the operating constraints;

defining a simulator for the memory in accordance with the parameter list using a first programming language;

developing a set of operations defining the test, wherein the set of operations is developed in a second programming language;

converting the set of operations from the second programming language to the first programming language; and verifying the test by passing the set of operations through the simulator, by (a) outputting an error message upon determining violation of any one of the operating constraints in the simulator;

(b) altering the set of operations in relation to the error message (c) converting the altered set of operations from the second programming language to the first programming language; and, (d) repeating (a), (b), and (c) until the set of operations passes through the simulator as a good test without outputting an error message.

12. The method of claim 11, further comprising:

passing the good test through a packer to minimize run time of the good test in relation to the operating constraints.

13. A method of generating a test for a memory having defined operating constraints, the method comprising:

creating an ordered-set of operations defining the test using a first programming language;

verifying the ordered-set of operations in a simulator capable of checking for violations of the operating constraints, wherein the first programming language is compatible with the simulator;

passing the verified ordered-set of operations through a packer to minimize run time of the test in relation to the operating constraints; and translating the ordered-set of operations into a second programming language compatible with a tester running the test.

14. A method of generating and verifying a test for a memory having defined operating constraints, the method comprising:

defining one or more commands, wherein each one of the commands comprises a group of operations;

forming a time ordered sequence of commands defining the test;

verifying the test by passing the time ordered sequence of commands through a simulator capable of determining whether the time order sequence of commands violates any one of the operating constraints;

passing the verified test through a packer to minimize run time of the test in relation to the operating constraints.

15. The method of claim 14 wherein the commands are defined in a first programming language and the simulator is compatible with a second programming language, the method further comprising:

translating the time ordered sequence of commands from the first programming language to the second programming language before verifying the test.

16. The method of claim 14, wherein the commands are defined in a first programming language compatible with the simulator, and wherein the test generated is run on a tester compatible with a second programming language, the method further comprising:

after passing the verified test through the packer, translating the test from the first programming language to the second programming language.

17. A method of generating a test for a memory having defined operating constraints, the method comprising:

developing a set of operations defining the test, where the set of operations is ordered in time;

passing the set of operations through a simulator to determine whether the set of operations violates any one of the operating constraints; and upon determining that the set of operations violates any one of the operating constraints, altering the set of operations into a set of altered operations.

18. The method of claim 17, further comprising passing the set of altered operations through the simulator to determine whether the altered set of operations violates any one of the operating constraints.

19. The method of claim 18, said altering the set of operations and said passing the altered set of operations through the simulator are repeated until said set of altered operations passes through the simulator without violating any one of the operating constraints.

20. A method of generating a test for a memory having defined operating constraints, the method comprising:

developing a set of operations defining the test, where the set of operations is ordered in time;

passing the set of operations through a simulator to determine whether the set of operations violates any one of the operating constraints;

upon determining that the set of operations violates any one of the operating constraints, outputting an error message; and altering the set of operations such that the operating constraint violation is eliminated.

* * * * *